United States Patent [19]

Sluss

[11] Patent Number: 4,730,273

[45] Date of Patent: Mar. 8, 1988

[54] ON-CHIP PROGRAMMABILITY VERIFICATION CIRCUIT FOR PROGRAMMABLE READ ONLY MEMORY HAVING LATERAL FUSES

[75] Inventor: Gene T. Sluss, Chippewa Falls, Wis.

[73] Assignee: Motorola, Inc., Schaumburg, Ill.

[21] Appl. No.: 847,974

[22] Filed: Apr. 3, 1986

[51] Int. Cl.[4] ............... G11C 17/00; G11C 29/00
[52] U.S. Cl. .................................. 365/96; 365/201
[58] Field of Search ............ 365/96, 104, 103, 201, 365/105, 230, 205, 207, 208; 371/21

[56] References Cited

U.S. PATENT DOCUMENTS

| | | | |
|---|---|---|---|
| 4,347,584 | 8/1982 | Fukushima et al. | 365/104 |
| 4,625,162 | 11/1986 | Bosnyak | 371/21 |
| 4,625,311 | 11/1986 | Fitzpatrick et al. | 371/21 |
| 4,670,708 | 6/1987 | Bosnyak et al. | 371/21 |

FOREIGN PATENT DOCUMENTS 0164494 10/1982 Japan ................................. 365/105

Primary Examiner—Stuart N. Hecker
Assistant Examiner—Glenn A. Gossage
Attorney, Agent, or Firm—William E. Koch

[57] ABSTRACT

A Programmable Read Only Memory (PROM) and an on-chip programmability verification circuit is provided that allows for the verification of the programmability of lateral fuses. The PROM comprises a plurality of word lines, a plurality of bit lines, and a plurality of fuses, wherein each of the fuses are uniquely coupled between one of the word lines and one of the bit lines. A sense amplifier is coupled between each of the word lines and an output terminal. One each of a plurality of variable voltage current sources having a test voltage applied thereto is coupled to one of the sense amplifiers for providing a current to the sense amplifier, and in turn to the word line and fuse, wherein the resistance of the fuse in relation to a nominal value may be determined by comparing the test voltage and an output voltage on the output terminal.

9 Claims, 3 Drawing Figures

ON-CHIP PROGRAMMABILITY VERIFICATION CIRCUIT FOR PROGRAMMABLE READ ONLY MEMORY HAVING LATERAL FUSES

FIELD OF THE INVENTION

This invention relates in general to Programmable Read Only Memories (PROMs) and, more particularly, to a PROM having an on-chip circuit that allows for the verification of the programmability of lateral fuses.

BACKGROUND OF THE INVENTION

PROMs conventionally comprise a plurality of lateral or vertical fuses wherein a predetermined number of fuses are located in a row coupled to a word line and another predetermined number of fuses are located in a column coupled to a bit line. In other words, each fuse is uniquely coupled in a combination of columns and rows.

When a fuse is intact (electrically closed), it represents one digital state, i.e., "1". When the fuse is programmed or "blown" (electrically open), it represents a different digital state, i.e., "0". PROMs are manufactured with the fuses in the closed state and are subsequently programmed by applying a relatively high voltage between selected word lines and bit lines to open specific fuses.

Vertical fuses typically comprise two back to back diodes having common anodes. The resistance of vertical fuses, and therefore their programmability, may be predicted fairly easily. Lateral fuses typically comprise a film of a material, i.e., nichrome, horizontally formed across a surface of the semiconductor chip. The resistance of lateral fuses can vary substantially; therefore, their programmability is not as predictable.

One previously known method of testing the programmability of lateral fuses was to have test rows and test columns, in addition to the normal rows and columns, manufactured on the PROM; program fuses between the test rows and test columns; and then test for fuses actually programmed. This would give some indication of the probability of the remaining fuses on the ROM of being programmed sucessfully.

However, this method required an abundance of additional space on the chip, consumed a large amount of testing time, and the results from the testing of the test fuses did not always correlate with the programming of the normal fuses.

Another previously known method of testing the programmability of lateral fuses was to program a sample of a group of ROMs; test the programmed sample for fuses actually programmed; and predict the programmability of the remaining ROMs from the group based on statistical probabilities.

However, this method destructively consumed the number of PROMs used in the sample and the results from the testing of the sample did not always correlate with the actual programming of the remaining group.

Thus, what is needed is an on-chip circuit that allows for the verification of the programmability of lateral fuses.

SUMMARY OF THE INVENTION

Accordingly, it is an object of the present invention to provide an improved PROM.

Another object of the present invention is to provide a PROM having on-chip circuitry that will allow for verification of the programmability of lateral fuses.

In carrying out the above and other objects of the invention in one form, there is provided a PROM and an on-chip programmability verification circuit that allows for the verification of the programmability of lateral fuses. The PROM comprises a plurality of word lines, a plurality of bit lines, and a plurality of fuses, wherein each of the fuses are uniquely coupled between one of the word lines and one of the bit lines. A sense amplifier is coupled between each of the word lines and an output terminal. One each of a plurality of variable voltage current sources having a test voltage applied thereto is coupled to one of the sense amplifiers for providing a current to the sense amplifier, and in turn to the word line and fuse, wherein the resistance of the fuse in relation to a nominal value may be determined by comparing the test voltage and an output voltage on the output terminal.

The above and other objects, features, and advantages of the present invention will be better understood from the following detailed description taken in conjunction with the accompanying drawings.

DETAILED DESCRIPTION OF THE INVENTION

Figure 1:
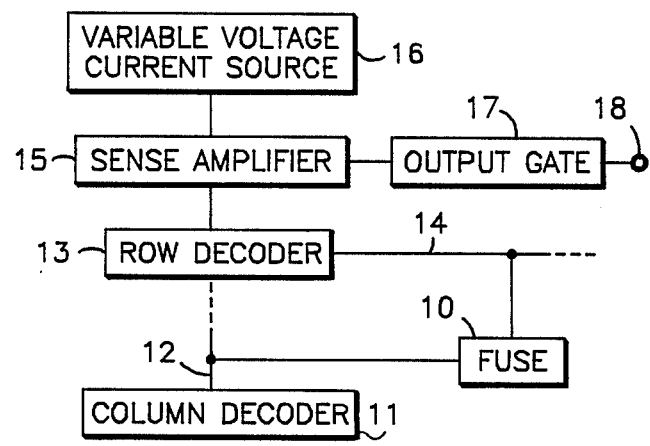
FIG. 1 is a block diagram of the present invention.

Referring to FIG. 1, a block diagram of the invention is shown which is suitable to be fabricated in monolithic integrated circuit form. Fuse 10 is coupled to column decode 11 by bit line 12 and to row decode 13 by word line 14. Fuse 10 represents a lateral fuse, a film of material such as nicrome, horizontally formed across the surface of a semiconductor chip in which the memory array is fabricated. Bit line 12 and word line 14 are only one each of a plurality of bit lines and word lines of a memory array, wherein one each of a plurality of fuses are uniquely coupled between each bit line and word line.

Column decode 11 and row decode 13 function in relation to bit line 12 and word line 14 as in previously known PROMs in a manner well known to those skilled in the art and which will be described in greater detail hereinafter. Furthermore, row decoder 13 may be omitted from the circuit in the case where each row has an output pin. Sense amplifier 15 is coupled between variable voltage current source 16 and row decode 13 for sensing the voltage on word line 14. Output gate 17 is coupled between sense amplifier 15 and output terminal 18 for providing a logical output of a "1" or a "0" depending on the voltage sensed by sense amplifier 15. Variable voltage current source 16 provides a current through sense amplifier 15, row decode 13 and word line 14 to fuse 10 for measuring the resistance of fuse 10. The method of determining the programability of the fuse by knowing its resistance will be discussed in greater detail hereinafter.

Figure 2:
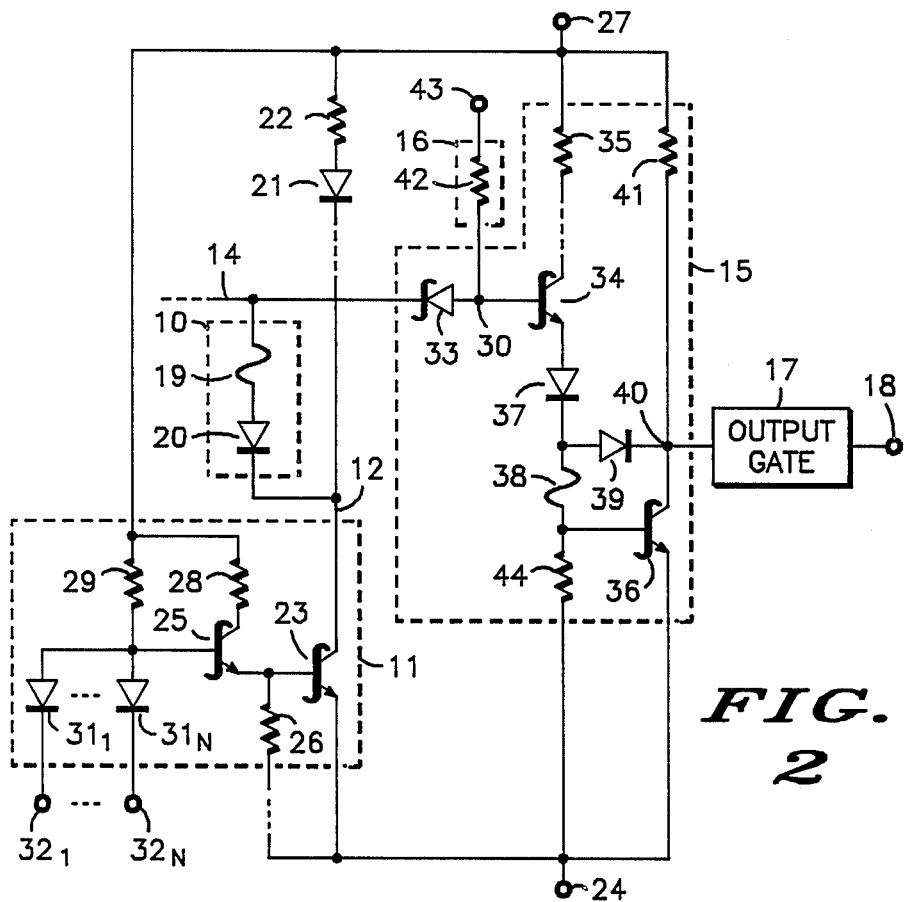
FIG. 2 is a partial schematic of one embodiment of the invention.

Referring to FIG. 2, fuse 10 comprises material 19 coupled between word line 14 and the anode of diode 20. The cathode of diode 20 is connected to bit line 12. Bit line 12 is further connected to the cathode of diode 21. Resistor 22 is coupled between the anode of diode 21 and supply voltage 27. The PROM is manufactured with material 19 intact (electrically closed) which represents one digital state, i.e., "1". PROMs are subsequently programmed by applying a relatively high voltage between selected word lines and bit lines to program specific fuses (programming circuitry not shown). When fuse 10 has been programmed, material 19 is electrically open, which represents another digital state, i.e., "0".

Column decode 11 comprises transistor 23 having a collector connected to bit line 12, an emitter connected to supply voltage terminal 24, and a base connected to the emitter of transistor 25 and coupled to supply voltage terminal 24 by resistor 26. Transistor 25 has a collector coupled to supply voltage terminal 27 by resistor 28, and a base coupled to supply voltage terminal 27 by resistor 29 and to the anodes of a plurality of diodes $31_I$–$31_n$, where "n" may be any integer. The cathodes of diodes $31_I$–$31_n$ are connected to terminals $32_I$–$32_n$ for receiving a column decode signal on each of terminals $32_I$–$32_n$. Column decode 11 provides a method of selecting the desired column by the proper application of column decode signals. For example, logical high signals on each of terminals $32_I$–$32_n$ will turn on transistors 25 and 23, thereby selecting bit line 12.

Sense amplifier 15 includes diode 33 having a cathode connected to word line 14 and an anode connected to node 30 for blocking programming current. Transistor 34 has a base connected to node 30, a collector coupled to supply voltage 27 by resistor 35 and an emitter both coupled to the base of transistor 36 by series connected diode 37 and material 38 and to the collector of transistor 36 by diode 39. Material 38 and diode 37 duplicate the resistance of fuse 10 and establish the proper voltage level for the output gate. Transistor 36 has an emitter coupled to supply voltage terminal 24, a base coupled to supply voltage terminal 24 by resistor 44, and a collector connected to the supply voltage terminal 27 by resistor 41 and to output gate 17. Sense amplifier 15 senses the voltage on word line 14 indicative of whether fuse 10 has been programmed and transfers this information to output gate 17 for providing the logical output signal to terminal 18.

Variable voltage current source 16 includes resistor 42 coupled between terminal 43 and node 30. This embodiment is illustrative of the case where each row has an output pin and row decoder 13 is not needed.

During normal operation, specific fuses of the memory array are programmed by the application of a high voltage to the connecting bit line 12 and word line 14. The state of the fuses may subsequently be read by sense amplifier 15 detecting the voltage on word line 14, which will be at one of two levels depending on whether fuse 10 has been programmed.

However, the ability to program fuse 10 depends on the resistance of material 19. Due to manufacturing inaccuracies, the resistance of material 19 may vary significantly. A resistance that is too large requires a large voltage drop inorder to sustain the same amount of power that is required to program the fuse. The programming voltage supply may not be able to sustain the high voltage. A resistance that is too small causes an overblow problem, i.e., current blowing additional fuses. The circuit described herein provides for a method of determining the resistance of each fuse on the array prior to programming, thereby giving a greater assurance of the programmability of each fuse. A test current applied to terminal 43 will flow through resistor 42, diode 33, selected word line 14 and fuse 10. By knowing the voltage and current applied to terminal 43 and the remaining resistance along the current path, the resistance of material 19 may be determined.

The integrity of the fuse is insured by assuming that there is some nominal resistance value that programs best. If the resistance varies from that nominal value by more than a predetermined amount, then that variance is detected from a knowledge of the voltage applied to terminal 43 and the state of the output on terminal 18 during the application of this voltage as follows. If bit line 12 is deselected by the application of a digital low signal on one of terminals $32_I$–$32_n$ and voltage $V_{CC}$ (same voltage as applied to supply voltage terminal 27) is applied to terminal 43, then transistor 36 will be saturated regardless of whether fuse 10 has been programmed. Therefore, node 40 will be low.

When bit line 12 is selected by the application of digital high signals on terminals $32_I$–$32_n$, voltage $V_{CC}$ is applied to terminal 43, and material 19 is unprogrammed, transistor 36 will be off and node 40 will be high provided that the voltage on node 30 is less than three $V_{BE}$. This becomes more apparent from the following analysis. It may be assumed that the base-emitter voltage of a transistor or the voltage across a diode ($V_{BE}$) equals approximately 0.8 volts; the voltage across a Schottky diode is approximately 0.6 volts; and the collector-emitter voltage of a saturated transistor is 0.2 volts. Then $$V_{30} = V_{33} + V_{20} + V_{23} + I_{23}(R_{19} + R_{20} + R_{33}) \text{ or}$$
$$< V_{34} + V_{37} + V_{36},$$

where
$V_{30}$ = voltage at node 30,
$V_{33}$ = voltage across Schottky diode 33,
$V_{20}$ = voltage across diode 20,
$V_{23}$ = voltage at collector of Schottky transistor 23,
$I_{23}$ = current to collector of Schottky transistor 23,
$R_{19}$ = resistance of material 19,
$R_{20}$ = resistance of diode 20 (forward biased),
$R_{33}$ = resistance of diode 33 (forward biased),
$V_{34}$ = base-emitter voltage of Schottky transistor 34,
$V_{37}$ = voltage across diode 37,
$V_{36}$ = base-emitter voltage of Schottky transistor 36,
where $$I_{23} = (V_{43} - V_{33} - V_{20} - V_{23})/(R_{42} + R_{33} + R_{19} + R_{20}),$$

where
$V_{43}$ = voltage applied to terminal 43,
$R_{42}$ = resistance of resistor 42.

The voltage on node 40 is approximately $V_{CC}$, provided the voltage on voltage terminal 27 is $V_{CC}$, the fuse is unprogrammed, and the voltage on node 30 is less than three $V_{BE}$. Consequently, if the fuse has been programmed, $R_{19}$ equals infinity and $$V_{30} = V_{43} - (R_{42})(I_{23}) \text{ or approximately}$$
$$V_{34} + V_{36} + V_{37}.$$

Therefore,
$V_{30} = 3 V_{BE}$ and $V_{40}$ equals a saturation voltage of 0.2 volts.

By increasing the voltage on node 30, the voltage on node 40 will switch from a high voltage ($V_{CC}$) to a low voltage (saturation voltage) whether or not fuse 10 has been programmed. This is accomplished by applying a large voltage (larger than $V_{CC}$) to terminal 43 to generate the necessary current through fuse 10 to cause the voltage on node 30 to become larger than, or equal to, 3 $V_{BE}$. The resistance of the fuse can then be determined as follows. There are two conditions that are of interest: a fuse that has a resistance less than a nominal range and a fuse that has a resistance greater than the nominal range.

To test for a fuse resistance lower than nominal, the current $I_{23}$ can be determined such that when the fuse is selected by the proper input signal at terminals $32_1$–$32_n$, the voltage at node 40 will be $V_{CC}$ when the fuse resistance is less than nominal and will be a saturation voltage when the fuse resistance is greater than or equal to nominal. To test for a fuse resistance higher than nominal, the current $I_{23}$ can be determined such that when the fuse is selected by the proper input signal at terminals $32_1$–$32_n$, the voltage at node 40 will be $V_{CC}$ when the fuse resistance is less than or equal to nominal and will be a saturation voltage when the fuse resistance is greater than nominal. The current $I_{23}$ for the two cases is generated by applying a different voltage at terminal 43. This voltage $V_{43}$ will be greater when testing for the fuse resistance lower than nominal and can be determined in both cases by defining the nominal acceptable range of resistance.

Figure 3:
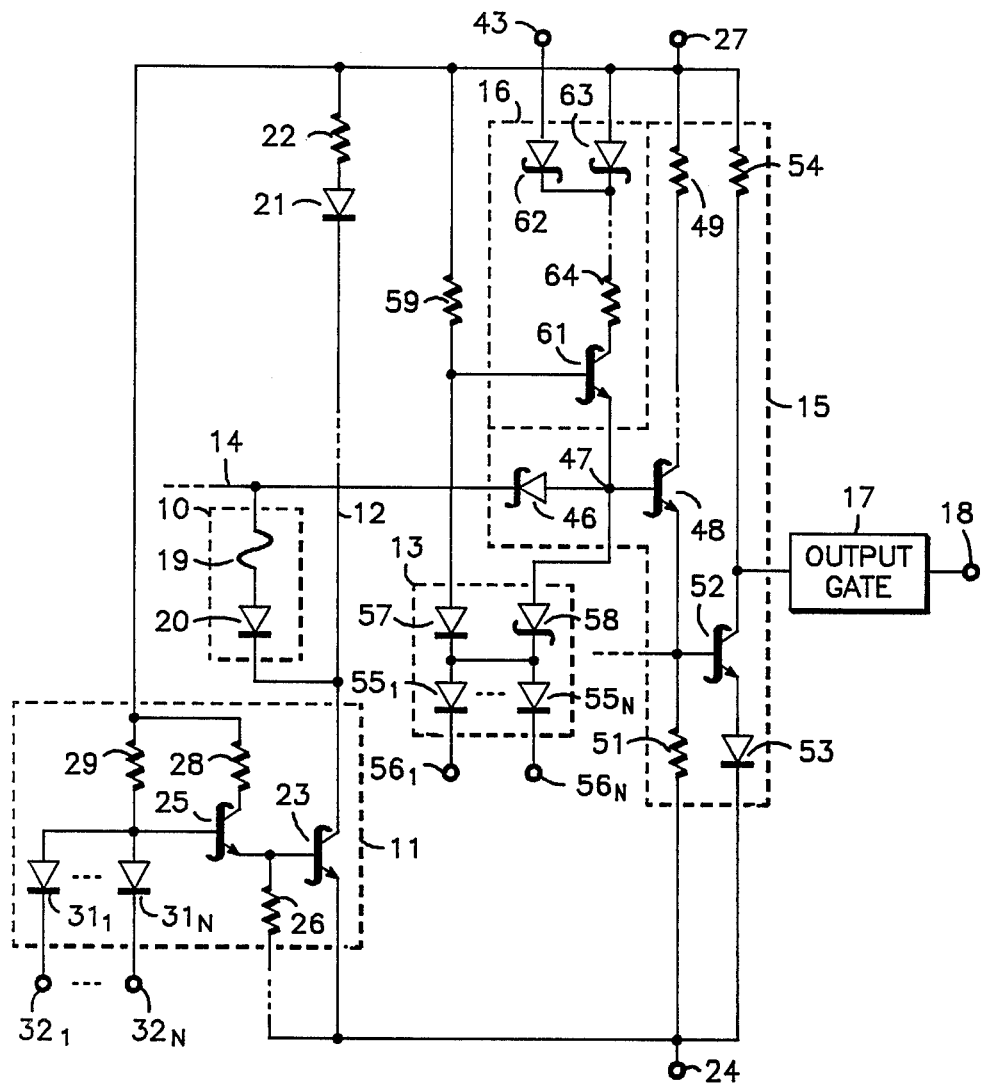
FIG. 3 is a partial schematic of a second embodiment of the invention.

Referring to FIG. 3, a second embodiment is shown that includes row decoder 13 for selecting a specific row. Fuse 10 and column decode 11 are as described in FIG. 2 and the various devices have been identified with identical numbers. Sense amplifier 15 includes diode 46 having a cathode connected to word line 14 and an anode connected to node 47. Transistor 48 has a base connected to node 47, a collector coupled to supply voltage terminal 27 by resistor 49, and an emitter coupled to supply voltage terminal 24 by resistor 51 and connected to the base of transistor 52. Transistor 52 has an emitter coupled to supply voltage terminal 24 by diode 53 and a collector coupled to supply voltage terminal 27 by resistor 54 and connected to output gate 17.

Row decode 13 includes diodes $55_1$–$55_n$ having their cathodes connected to terminals $56_1$–$56_n$ for receiving one each of a plurality of row decode signals on each of terminals $56_1$–$56_n$. Diodes $55_1$–$55_n$ have their anodes connected to the cathodes of diode 57 and Schottky diode 58. The anode of diode 57 is coupled to supply voltage terminal 27 by resistor 59 and is connected to the base of transistor 61. The anode of diode 58 is connected to node 47. Row decode 13 provides a method of selecting the desired row by the proper application of row decode signals. For example, logical high signals on each of terminals $56_1$–$56_n$ will prevent any current from being sunk from the base of transistor 48, thereby selecting word line 14 shown.

Variable voltage current source 16 includes transistor 61 having an emitter connected to node 47 and a collector coupled to the cathodes of Schottky diodes 62 and 63 by resistor 64. The anodes of diodes 62 and 63 are connected to terminal 43 and supply voltage terminal 27, respectively.

The programmability of fuse 10 is determined by analysis similar to that described for the circuit of FIG. 2 by knowing the voltage and current applied to terminal 43 and the remaining resistance along the current path, the resistance of material 19 may be determined.

By now it should be appreciated that an on-chip circuit has been provided that allows for the verification of the programmability of lateral fuses.

What is claimed is:

1. A programmable memory circuit comprising:
   a plurality of word lines;
   a plurality of bit lines;
   a plurality of fuses, each of said fuses uniquely coupled between one of said word lines and one of said bit lines;
   first means coupled to said plurality of bit lines for selecting one of said bit lines;
   a first diode having a cathode coupled to one of said word lines and an anode;
   second means coupled to said anode of said first diode for selecting one of said word lines;
   an output terminal;
   a first supply voltage terminal;
   a second supply voltage terminal;
   third means coupled to said first and second supply voltage terminal and coupled between said anode of said first diode and said output terminal for sensing the voltage on one of said word lines and translating said voltage to one of said output terminals as an output signal;
   a first resistor;
   a second resistor;
   a test voltage terminal coupled for receiving a test voltage;
   a second diode having an anode coupled to said test voltage terminal and a cathode; and
   a transistor having a base coupled to said first supply voltage terminal by said first resistor and to said second means, an emitter coupled to said anode of said first diode, and a collector coupled to said anode of said second diode by said second resistor.

2. The circuit according to claim 1 further comprising a third diode having an anode coupled to said first supply voltage terminal and a cathode couple to said cathode of said second diode.

3. The circuit according to claim 2 wherein said second means comprises:
   a plurality of input terminals;
   a plurality of fourth diodes, each of said fourth diodes having a cathode coupled to one of said input terminals, and an anode coupled to a node;
   a fifth diode having a cathode to said node and an anode coupled to said base of said transistor; and
   a sixth diode having a cathode coupled to said node and an anode coupled to said emitter of said transistor.

4. The circuit according to claim 3 further comprising an output gate coupled between said third means and said output terminal.

5. The circuit according to claim 3 wherein each of said fuses comprises a material laterally formed on a monlithic integrated circuit.

6. The circuit according to claim 5 wherein each of said fuses further comprises a seventh diode having a cathode coupled to one of said bit line, said material coupled between one of said word line and an anode of said seventh diode.

7. An improved programmable memory circuit including a plurality of lateral fuses, first means coupled to said plurality of lateral fuses for selecting one of said plurality of fuses, second means coupled to said plurality of lateral fuses for sensing a voltage across one of said plurality of fuses and providing an output, wherein the improvement comprises:
   a first resistor;
   a second resistor;

a supply voltage terminal;

a test voltage terminal coupled for receiving a test voltage;

a first diode having an anode coupled to said test voltage terminal and a cathode; and a transistor having a base coupled to said supply voltage terminal by said first resistor, an emitter coupled to said second means, and a collector coupled to said anode of said second diode by said second resistor.

8. The circuit according to claim 7 wherein said third means further comprises a second diode having an anode coupled to said supply voltage terminal and a cathode coupled to said cathode of said first diode.

9. The circuit according to claim 7 wherein said first means comprises:

a plurality of input terminals;

a plurality of third diodes, each of said third diodes having a cathode coupled to one of said input terminals, and an anode coupled to a node;

a fourth diode having a cathode coupled to said node and an anode coupled to said base of said transistor; and a fifth diode having a cathode coupled to said node and an anode coupled to said emitter of said transistor.

* * * * *

UNITED STATES PATENT AND TRADEMARK OFFICE
CERTIFICATE OF CORRECTION

PATENT NO. : 4,730,273

DATED : March 8, 1988

INVENTOR(S) : Gene T. Sluss

It is certified that error appears in the above-identified patent and that said Letters Patent is hereby corrected as shown below:

Column 6, claim 3, line 44, after "cathode" add --coupled--.

Signed and Sealed this

Twenty-ninth Day of November, 1988

Attest:

DONALD J. QUIGG

*Attesting Officer*     *Commissioner of Patents and Trademarks*